(12) United States Patent
Stumpf et al.

(10) Patent No.: US 8,893,702 B2
(45) Date of Patent: Nov. 25, 2014

(54) DUCTILE MODE MACHINING METHODS FOR HARD AND BRITTLE COMPONENTS OF PLASMA PROCESSING APPARATUSES

(71) Applicant: Lam Research Corporation, Fremont, CA (US)

(72) Inventors: John F. Stumpf, Kettering, OH (US); Timothy Dyer, San Leandro, CA (US); David Allen Ruberg, Hamilton, OH (US); Lihua L. Huang, Pleasanton, CA (US)

(73) Assignee: Lam Research Corporation, Fremont, CA (US)

( * ) Notice: Subject to any disclaimer, the term of this patent is extended or adjusted under 35 U.S.C. 154(b) by 134 days.

(21) Appl. No.: 13/771,933

(22) Filed: Feb. 20, 2013

(65) Prior Publication Data

US 2014/0235061 A1    Aug. 21, 2014

(51) Int. Cl.
| | | |
|---|---|---|
| *B28D 1/02* | (2006.01) |
| *B28D 1/16* | (2006.01) |
| *B23B 5/00* | (2006.01) |
| *B23P 6/00* | (2006.01) |
| *H01L 21/3065* | (2006.01) |

(52) U.S. Cl.
CPC ... *B28D 1/16* (2013.01); *B23B 5/00* (2013.01); *B23P 6/00* (2013.01); *H01L 21/3065* (2013.01)
USPC ............... 125/10; 451/58; 264/138; 264/162; 264/293

(58) Field of Classification Search
CPC ............ B28D 1/18; B28D 1/003; B28D 7/04; B23D 45/024; B23D 45/027
USPC ............. 125/10; 451/58, 523, 520, 521, 522; 219/121.6, 121.85; 438/84, 95, 102; 264/138, 162, 293, 482
See application file for complete search history.

(56) References Cited

U.S. PATENT DOCUMENTS

| | | | |
|---|---|---|---|
| 4,356,376 A | * | 10/1982 | Komanduri et al. ..... 219/121.72 |
| 4,710,642 A | | 12/1987 | McNeil |
| 4,978,567 A | | 12/1990 | Miller |

(Continued)

FOREIGN PATENT DOCUMENTS

| | | |
|---|---|---|
| EP | 0600365 A1 | 6/1994 |
| EP | 0803485 A2 | 10/1997 |
| JP | H9-239639 A | 9/1997 |

OTHER PUBLICATIONS

Egashira, Kai et al., "Micro-drilling of monocrystalline silicon using a cutting tool", Precision Engineering, vol. 26, Issue 3, Jul. 2002, p. 263-268 (Abstract only).

(Continued)

*Primary Examiner* — George Nguyen
(74) *Attorney, Agent, or Firm* — Buchanan Ingersoll & Rooney PC (57) ABSTRACT

A method of ductile mode machining a component of a plasma processing apparatus wherein the component is made of nonmetallic hard and brittle material wherein the method comprises single point turning the component with a diamond cutting tool causing a portion of the nonmetallic hard and brittle material to undergo a high pressure phase transformation to form a ductile phase portion of the hard and brittle material during chip formation wherein a turned surface is formed from a phase changed material and the turned surface is a grooved textured surface of phase changed material.

20 Claims, 5 Drawing Sheets

(56) References Cited

U.S. PATENT DOCUMENTS

| | | | |
|---|---|---|---|
| 5,684,293 A | 11/1997 | Kessler | |
| 5,951,814 A | 9/1999 | Saito et al. | |
| 5,993,594 A | 11/1999 | Wicker et al. | |
| 5,993,597 A | 11/1999 | Saito et al. | |
| 6,310,755 B1 | 10/2001 | Kholodenko et al. | |
| 6,418,921 B1 | 7/2002 | Schmid et al. | |
| 6,436,229 B2 | 8/2002 | Tai et al. | |
| 6,443,817 B1 | 9/2002 | McCarter et al. | |
| 6,805,952 B2 | 10/2004 | Chang et al. | |
| 6,818,097 B2 | 11/2004 | Yamaguchi et al. | |
| 6,858,080 B2 | 2/2005 | Linares et al. | |
| 6,916,503 B2 | 7/2005 | Morikawa et al. | |
| 6,991,521 B1 | 1/2006 | Hagan et al. | |
| 7,002,100 B2 | 2/2006 | Wu et al. | |
| 7,250,114 B2 * | 7/2007 | Kiehlbauch et al. | 216/31 |
| 7,398,014 B1 | 7/2008 | Camm et al. | |
| 7,442,114 B2 * | 10/2008 | Huang et al. | 451/57 |
| 7,479,304 B2 | 1/2009 | Sun et al. | |
| 7,507,670 B2 | 3/2009 | Shih et al. | |
| 7,508,116 B2 | 3/2009 | Liu | |
| 7,510,664 B2 | 3/2009 | Carr | |
| 7,662,723 B2 | 2/2010 | Hwang et al. | |
| 7,686,988 B2 * | 3/2010 | Hosoe | 264/2.5 |
| 7,785,417 B2 | 8/2010 | Ni et al. | |
| 7,869,184 B2 | 1/2011 | Steger | |
| 7,909,549 B2 | 3/2011 | Kondoh et al. | |
| 8,025,731 B2 | 9/2011 | Ni et al. | |
| 8,051,548 B2 | 11/2011 | Miyashita et al. | |
| 8,053,705 B2 * | 11/2011 | Shin | 219/121.76 |
| 8,206,506 B2 | 6/2012 | Kadkhodayan et al. | |
| 8,216,418 B2 | 7/2012 | Patrick et al. | |
| 8,277,671 B2 | 10/2012 | Everson et al. | |
| 8,313,610 B2 | 11/2012 | Dhindsa | |
| 8,313,805 B2 | 11/2012 | Kadkhodayan et al. | |
| 2005/0133947 A1 * | 6/2005 | Jang | 264/162 |
| 2006/0120816 A1 | 6/2006 | Morimoto et al. | |
| 2007/0108161 A1 | 5/2007 | Murugesh et al. | |
| 2007/0284339 A1 | 12/2007 | Moore et al. | |
| 2008/0289958 A1 | 11/2008 | Kardokus et al. | |
| 2009/0000742 A1 | 1/2009 | Okesaku et al. | |
| 2010/0041238 A1 | 2/2010 | Cooperberg et al. | |
| 2010/0065536 A1 | 3/2010 | Patten | |
| 2010/0120337 A1 | 5/2010 | Kuriyama et al. | |
| 2011/0056626 A1 | 3/2011 | Brown et al. | |
| 2011/0265616 A1 | 11/2011 | Choyke et al. | |
| 2012/0024827 A1 * | 2/2012 | Shin | 219/121.61 |
| 2012/0039680 A1 | 2/2012 | Koike et al. | |
| 2012/0219930 A1 | 8/2012 | Heinz et al. | |

OTHER PUBLICATIONS

Patten, John A. et al. "The Effects of Laser Heating on the Material Removal Process in Si and SiC Nanomachining", Manufacturing Research Center, Western Michigan University, Kalamazoo, Michigan USA, NFS Grant #0757339, NSF Program Name: CMMI, Proceedings of 2011 NFS Engineering Research and Innovation Conference, Atlanta, GA (11 pgs.).

Ravindra, Deepak et al., "The Effect of Laser Heating on the Ductile to Brittle Transition of Silicon Carbide", Manufacturing Research Center, Western Michigan University, Kalamazoo, Michigan USA (4 pgs.).

Ravindra, Deepak et al., "Ductile Regime Single Point Diamond Turning of Quartz", Manufacturing Research Center, Western Michigan University, Kalamazoo, Michigan USA (6 pgs.).

Ravindra, Deepak et al., "The Effect of Laser Heating on the Ductile to Brittle Transition in Silicon", Manufacturing Research Center, Western Michigan University, Kalamazoo, Michigan USA, ICOMM/4M, 2010 (5 pgs.).

Ravindra, Deepak et al., "Single Point Diamond Turning Effects on Surface Quality and Subsurface Damage to Ceramics", MSEC2009-84113, Proceedings of the ASME 2009 International Manufacturing Science and Engineering Conference, Oct. 4-7, 2009, West Lafayette, Indiana USA (7 pgs.).

Shayan, Amir R. et al., Force Analysis, Mechanical Energy and Laser Heating Evaluation of Scratch Tests on Silicon Carbide (4H-Sic) in Micro-Laser Assisted Machining (μ-LAM) Process, MSEC2009-84207, Proceedings of the ASME 2009 International Manufacturing Science and Engineering Conference, Oct. 4-7, 2009, West Lafayette, Indiana USA, Copyright © 2009 by ASME (6 pgs.).

Zhang, Yinzia et al., "Study on Subsurface Damage Model of the Ground Monocrystalline Silicon Wafers", Key Engineering Materials, vol. 416 (2009), www.scientific.net (2009), Trans Tech Publications, Switzerland (Abstract only).

Ravindra, Deepak et al., "Ductile regime single point diamond turning of CVD-SiC resulting in an improved and damage-free surface", Mechanical and Aeronautical Engineering, Western Michigan University, Kalamazoo, Michigan 49008 USA (6 pgs.), Asian Symposium on Materials & Processing, Penang, Malaysia 2009.

* cited by examiner

DUCTILE MODE MACHINING METHODS FOR HARD AND BRITTLE COMPONENTS OF PLASMA PROCESSING APPARATUSES

FIELD OF THE INVENTION

The present invention relates to machining components of plasma processing apparatuses and more specifically relates to single point turning a component formed of nonmetallic hard and brittle material for a plasma processing apparatus.

BACKGROUND

In the field of semiconductor material processing, for example, semiconductor material processing apparatuses including vacuum processing chambers are used performing various processes, such as etching and deposition of various materials on substrates, and resist stripping. As semiconductor technology evolves, decreasing transistor sizes call for an ever higher degree of accuracy, repeatability and cleanliness in wafer processes and process equipment. Various types of equipment exist for semiconductor processing, including applications that involve the use of plasmas, such as plasma etch, reactive ion etching, plasma-enhanced chemical vapor deposition (PECVD) and resist strip. The types of equipment required for these processes include components which are disposed within the plasma chamber, and must function in that environment. The environment inside the plasma chamber may include exposure to the plasma, exposure to etchant gasses, exposure to ultraviolet light, and thermal cycling. Materials used for such components must be adapted to withstand the environmental conditions in the chamber, and do so for the processing of many wafers which may include multiple process steps per wafer. To be cost effective, such components must often withstand hundreds or thousands of wafer cycles while retaining their functionality and cleanliness. There is generally extremely low tolerance for components which produce particles, even when those particles are few and no larger than a few tens of nanometers. It is also necessary for components selected for use inside plasma processing chambers to meet these requirements in the most cost-effective manner To this end, brittle components which form, for example, a showerhead electrode, are subjected to a mechanical machining operation in order to finish the component surface. However the surface treatment by means of a mechanical machining operation results in small, nearly invisible microcracks or holes in the surface of the brittle components. These microcracks or subsurface damage adversely affects the different subsequent semiconductor manufacturing processes (e.g., the semiconductor layer deposition, or high temperature anneal) as all kinds of contaminations may accumulate in said microcracks, which contaminations can be freed from said microcracks during the semiconductor process, thereby contaminate the semiconductor layer deposition on the wafers. For example, a chamber component surface with subsurface damage can release particles due to erosion and/or etching of the surface which causes subsurface microcracks to link and liberate particles. The latter will result in significantly reduced quality or rejection of products.

SUMMARY

Disclosed herein is a method of ductile mode machining a component of a plasma processing apparatus wherein the component is made of nonmetallic hard and brittle material. The method comprises single point turning the component with a diamond cutting tool causing a portion of the nonmetallic hard and brittle material to undergo a high pressure phase transformation to form a ductile phase portion of the hard and brittle material during chip formation wherein a turned surface is formed from a phase changed material and the turned surface is a grooved textured surface of phase changed material.

DETAILED DESCRIPTION

Disclosed herein is a method of ductile mode machining a component of a plasma processing apparatus wherein the component is made of a nonmetallic hard and brittle material. As used herein, nonmetallic hard and brittle material means a ceramic, silicon containing (single or polycrystalline silicon containing), and/or quartz material suitable for use as a component in a semiconductor processing chamber, and more specifically a material which includes quartz, silicon, silicon carbide, silicon nitride, aluminum oxide, aluminum nitride, boron carbide, yttria, zirconia, diamond, sapphire, glass, or the like. Under normal conditions, semiconductor and ceramic materials are hard and brittle and do not readily plastically deform.

To achieve plastic deformation (i.e. ductile mode) of these hard and brittle materials, a portion of the surface of the component preferably undergoes a high pressure phase transformation. Present embodiments of methods of ductile mode machining preferably take advantage of the small size scale ductile plastic response by controlling parameters such as the depth of cut, feed rate, component rotation speed, and tool geometry to a portion of the component during a single point turning process wherein the single point turning process is performed such that a portion of the nonmetallic hard and brittle material of the component undergoes a high pressure phase transformation, forming a ductile phase portion of the brittle material.

The single point turning process is performed with a single point diamond cutting tool, preferably a single crystal diamond cutting tool, wherein the single point turning process forms plastically deformed portions of the nonmetallic hard and brittle material of the component. Ductile phase portions of the nonmetallic hard and brittle material of the component are removed in the single point turning process such that a turned surface is formed from a phase changed material wherein the turned surface is a grooved textured surface of phase changed material.

The turning process can remove ductile phase portions of the nonmetallic hard and brittle material from the component such that the turned surface of the component is ductile mode machined into a predetermined shape wherein remaining portions of the amorphous phase can form the grooved textured surface. The phase changed material of the turned surface of the component forms a finished surface, wherein if the component is made of high purity silicon, the phase changed material can include α-Si, Si-III, Si-XII, or a mixture thereof, and may comprise a predetermined contoured surface geometry and a predetermined surface roughness (Ra). The predetermined surface roughness of the turned surface of the component forms the grooved textured surface of the turned component. Preferably when formed the surface roughness of the turned surface of the component has a roughness of about 0.001 to 0.2 µm. As used herein the term "surface roughness" is represented as an arithmetic mean value (Ra) for the surface roughness measurement. Additionally, as used herein the term "about" refers to ±10%.

Preferably, embodiments of methods of ductile mode machining the component of a plasma processing apparatus will form a component having a finished turned surface formed from a high pressure phase transformation wherein phase changed material forms the finished turned surface and wherein the phase changed material forming the finished turned surface has a thickness of about 0.01 to 2 µm and more preferably of about 0.01 to 0.5 µm.

Suitable components for use in plasma processing apparatuses are formed from ceramic, silicon containing, and/or quartz materials, and can include edge rings, showerhead electrodes, chamber windows, chamber liners, gas injectors, plasma confinement rings, and electrostatic chucks.

Figure 1:
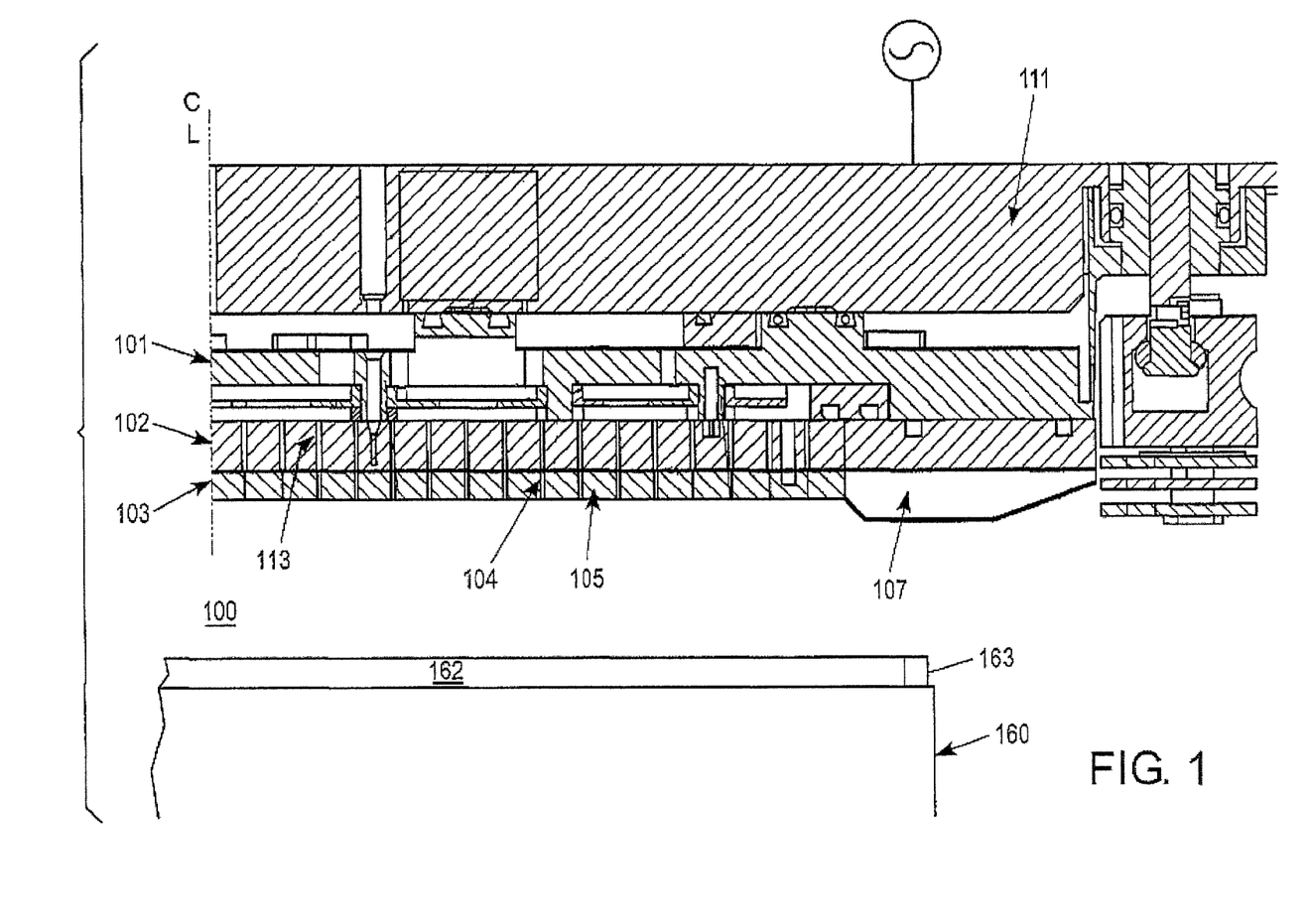
FIG. 1 illustrates a showerhead electrode assembly of a semiconductor plasma processing apparatus which may include a component of nonmetallic hard and brittle material formed according to a ductile mode machining method disclosed herein.

FIG. 1 depicts one-half of a showerhead assembly 100 of a parallel plate capacitively-coupled plasma chamber (vacuum chamber) comprising a top electrode 103 and an optional backing member 102 secured to the top electrode 103, a thermal control plate 101, and a top plate 111. Thermal chokes 112 can be provided on the upper surface of the thermal control plate 101. Additionally, the showerhead assembly 100 can include plasma confinement rings 110. The top electrode 103 is positioned above a substrate support 160 which has an electrostatic chuck embedded therein. The substrate support 160 is configured to support a semiconductor substrate 162, (e.g., semiconductor wafer), and an edge ring 163 may be fitted around the semiconductor substrate 162 to enhance etch uniformity during processing of the semiconductor substrate 162. The upper surface of the substrate support 160, which includes the electrostatic chuck therein, can be a planar surface, wherein the surface is preferably formed with a method of ductile mode machining disclosed herein. In an alternative embodiment, the upper surface of the substrate support 160, can include grooves for supplying helium to a backside of a substrate, wherein the upper surface is preferably formed with a method of ductile mode machining disclosed herein. Details of a substrate support including grooves for supplying helium to a backside of a substrate can be found in commonly-assigned U.S. Pat. No. 7,869,184 which is incorporated herein by reference in its entirety.

The top plate 111 can form a removable top wall of the plasma processing apparatus, such as a plasma etch chamber. As shown, the top electrode 103 can be a showerhead electrode which includes an inner electrode member 105, and an optional outer electrode member 107. The inner electrode member 105 is typically made of single crystal silicon. If desired, the inner and outer electrodes 105, 107 can be made of a single piece of material such as CVD silicon carbide, single crystal silicon or other suitable material such as silicon based electrode material including aluminum oxide or the like.

Single crystal silicon is a preferred material for plasma exposed surfaces of the inner electrode member 105 and the outer electrode member 107. High-purity, single crystal silicon minimizes contamination of substrates during plasma processing as it introduces only a minimal amount of undesirable elements into the reaction chamber, and also wears smoothly during plasma processing, thereby minimizing particles.

The showerhead electrode assembly 100 can be sized for processing large substrates, such as semiconductor wafers having a diameter of 300 mm. For 300 mm wafers, the top electrode 103 is at least 300 mm in diameter. However, the showerhead electrode assembly can be sized to process other wafer sizes or substrates having a non-circular configuration.

Figure 2:
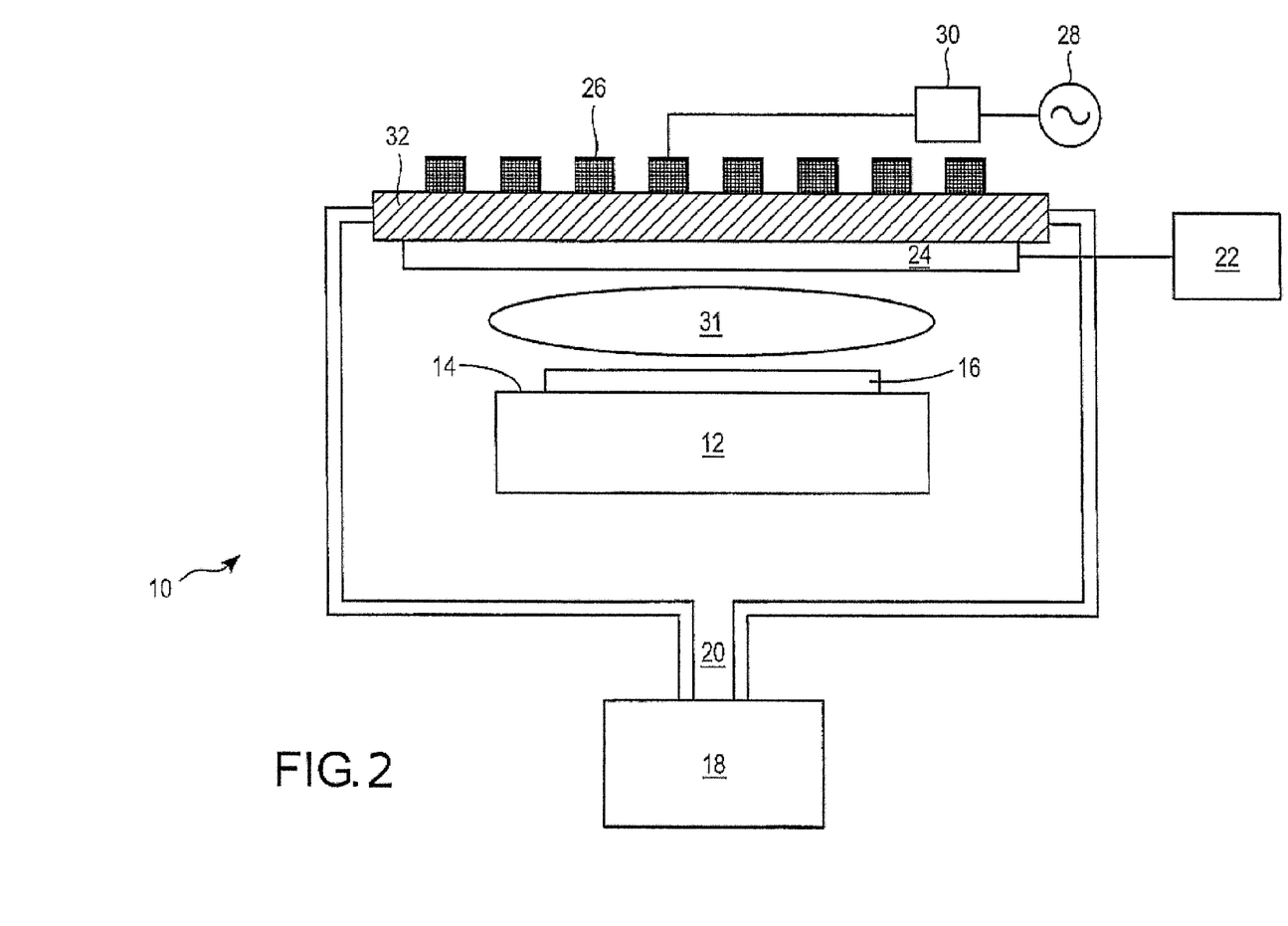
FIG. 2 illustrates a semiconductor plasma processing apparatus which may include a component of nonmetallic hard and brittle material formed according to a ductile mode machining method disclosed herein.

FIG. 2 is a cross-sectional view of an alternate embodiment of a plasma processing chamber 10 wherein the plasma processing chamber 10 is inductively coupled. An example of an ICP plasma processing chamber is the TCP® etch or deposition system, manufactured by Lam Research Corporation, Fremont, Calif. The ICP plasma processing chamber is also described, for example, in commonly-assigned U.S. Pat. No. 6,805,952, which is incorporated by reference in its entirety. Processing chamber 10 includes a substrate support 12 with support surface 14. The support surface 14 is adapted to support substrate 16. A vacuum pump 18 is attached to pump port 20 to maintain the interior processing chamber 10 at a low pressure (e.g., between about 1 mTorr to about 50 mTorr). A gas source 22 supplies process gases to the interior of processing chamber 10 through a gas distribution plate, showerhead arrangement, injector or other suitable arrangement. Process gases can be introduced by the gas distribution member 24 to a zone adjacent to substrate 16.

In an embodiment, a dielectric window 32 underlies planar antenna 26 and forms the top wall of plasma processing chamber 10. The dielectric window 32 can have a through passage extending therethrough wherein a gas injector may be inserted and provide a process gas to the plasma processing chamber 10. High-density plasma 31 is generated in the zone between dielectric window 32 and substrate 16, for either deposition or etching of substrate 16.

Figure 3A:
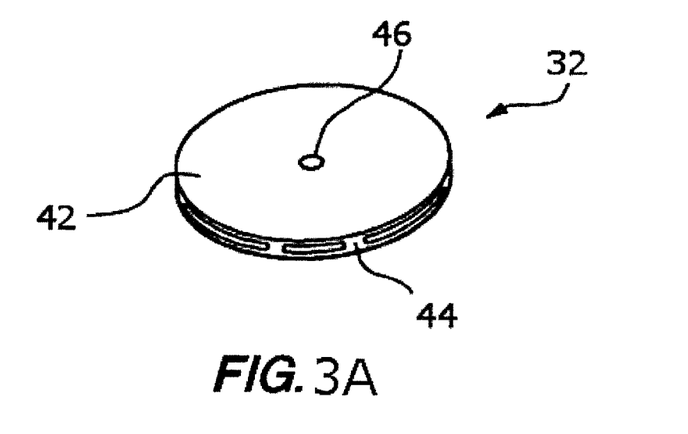
FIGS. 3A, 3B illustrate a dielectric window and gas injector which may include surfaces formed according to a ductile mode machining method disclosed herein.
Figure 3B:
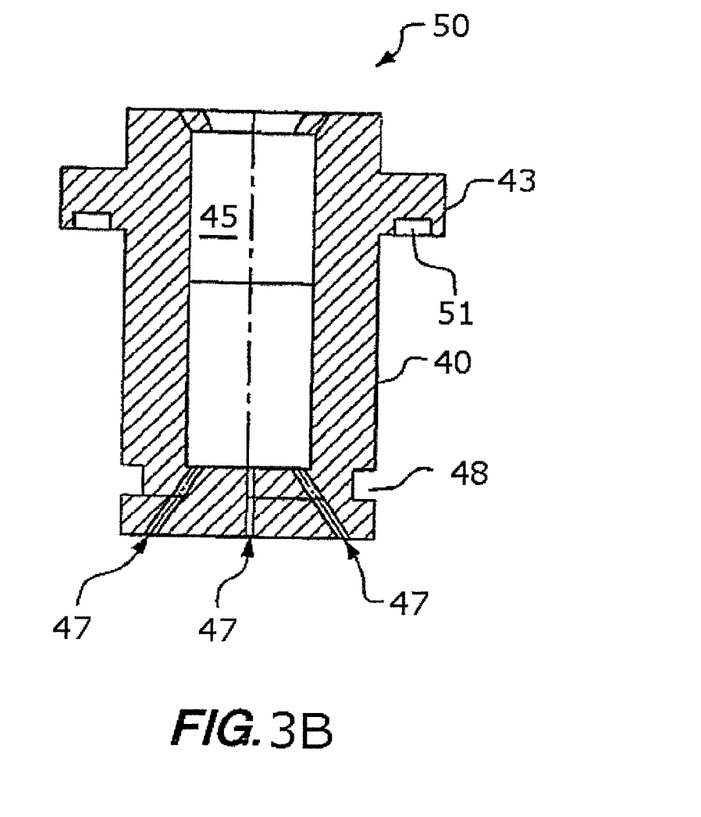

FIG. 3A shows an exemplary dielectric window 32 including parallel planar surfaces 42 (which may be planarized according to a method of ductile mode machining disclosed herein), a side surface 44, and a through passage 46. Dielectric windows can be made of quartz or a ceramic material wherein the ductile mode machining process forms a finished surface on at least a plasma exposed surface (i.e. a lower parallel planar surface) of the parallel planar surfaces 42 and more preferably both of the parallel planar surfaces 42. Preferably a gas injector 50 extends through the through passage 46. As shown in the cross-sectional view of FIG. 3B, the gas injector 50 includes a cylindrical body 40 having a flange 43 at an upper end thereof, a central bore 45 extending through the upper axial end, a plurality of gas holes 47 extending between the bore and the exterior surface of the lower axial end, and O-ring grooves 48, 51. Gas injectors can be made of a dielectric material such as a ceramic or quartz material wherein the gas injector 50 comprises holes 47 for delivering a process gas therethrough. Details of an exemplary tunable multi-zone gas injection system including a dual zone gas injector and dielectric window which can be formed according to methods disclosed herein can be found in commonly-assigned U.S. Patent Application No. 2010/0041238, which is incorporated by reference in its entirety.

According to a preferred embodiment, nonmetallic hard and brittle components of plasma processing apparatuses include plasma exposed surfaces formed through a ductile mode machining process. The methods of ductile mode machining disclosed herein may be used to form contoured geometrical surfaces or planar surfaces on any component of a plasma processing apparatus such as a showerhead electrode, gas distribution plate, gas injector, an edge ring, or a dielectric window wherein the component is made of a nonmetallic hard and brittle material such as quartz, silicon, silicon carbide, silicon nitride, aluminum oxide, aluminum nitride, boron carbide, yttria, zirconia, diamond, sapphire, glass, or the like. For example, the contoured surface geometry may be a three dimensional surface of a bevel, a chamfer, or a radii of the component. Alternatively, a planar surface can be formed over a component wherein the ductile mode machined surface has a variation in flatness of the planar surface less than about 1.4 μm, or more preferably a variation in flatness of the planar surface of less than about 0.3 μm.

The method comprises single point turning the component with a diamond cutting tool while controlling the depth of cut, causing a portion of the nonmetallic hard and brittle material to undergo a high pressure phase transformation and form a ductile phase portion and an amorphous phase portion of the brittle material during chip formation. The method further comprises removing some of the amorphous phase portion of the hard and brittle material such that a surface of the component is turned into a predetermined shape. Preferably the turned surfaced is textured with grooves (grooved textured surface) and has a predetermined surface roughness of about 0.001 to 0.2 μm wherein the surface roughness of the turned surface forms the grooves. The surface roughness of the turned surface may be controlled by process parameters such as the feed rate, component rotational speed, geometry of the cutting tool, and depth of cut, wherein, for example, a predetermined surface roughness may be selected such that the turned surface increases adhesion of nonvolatile etch byproducts and processing residues. Preferably the ductile mode machined surface of the component of nonmetallic hard and brittle material, when formed, will be subsurface damage free wherein the grooved textured surface of the component is formed from the phase changed material having a thickness of about 0.01 to 2 μm and more preferably of about 0.01 to 0.5 μm and wherein the phase changed material forms the finished turned surface of the component.

Preferably during the ductile mode machining process the component formed from the nonmetallic hard and brittle material undergoes a high pressure phase transformation such that the machining is performed in a ductile mode as opposed to a brittle mode, wherein the ductile mode can reduce the brittle fracture of the hard and brittle material during machining. Under extremely high pressures, such as those which occur at the contact interface between a cutting tool and the component, dielectric, semiconductor, conductive, quartz, silicon containing, and ceramic materials transform from covalent and/or ionic bonded structures to high pressure phase transformed metallic structures. The diamond cutting tool performing the single point turning therefor provides pressure on the component of nonmetallic hard and brittle material such that a portion of the component undergoes a phase change and transforms to a high pressure metallic phase portion.

Figure 4A:
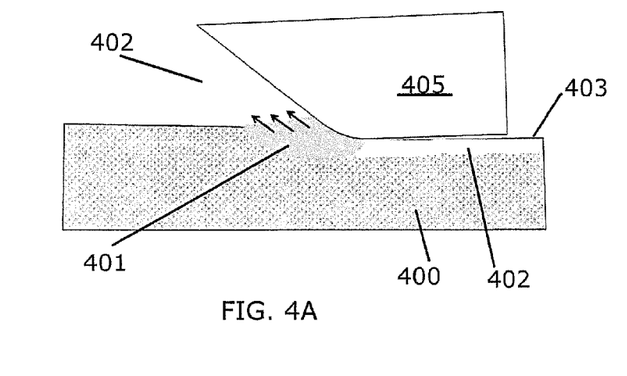
FIG. 4A illustrates an exemplary model of a high pressure phase transformation which occurs during ductile mode machining a component of hard and brittle material.
Figure 4B:
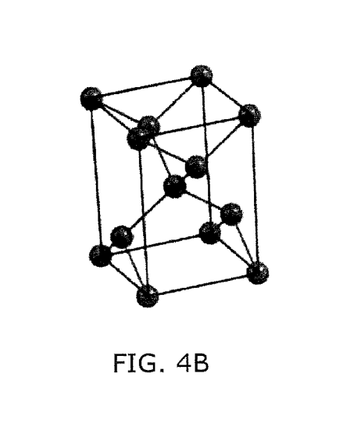
FIG. 4B illustrates an $\alpha$-diamond crystalline structure of a silicon component.
Figure 4C:
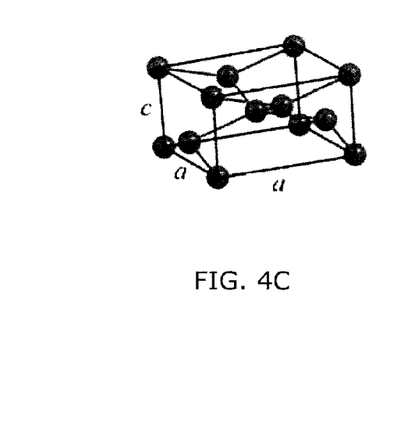
FIG. 4C illustrates a $\beta$-Sn crystalline structure of a silicon component.

FIG. 4A illustrates a high pressure phase transformation at the contact point between a silicon component 400 and the cutting tool 405 during a ductile mode machining method disclosed herein. The high pressure phase transformation forms a ductile phase portion 401 and surrounding amorphous phase portions 402 on the upper surface of the silicon component. During the single point turning process of silicon, a surface layer of the amorphous phase is removed during chip formation while the remaining phase changed material forms the turned surface 403 of the silicon component 400. The high pressure phase transformation which occurs at the contact point between the cutting tool and the silicon component converts silicon to a high pressure ductile phase. During ductile mode machining of silicon, the silicon has an α-diamond structure which transforms to β-tin as pressure reaches 11 GPa and as pressure is released amorphous, Si-III and Si-XII phases are formed. The transient β-Sn phase crystal structure of Si is shown in FIG. 4C and the α-diamond phase crystal structure of silicon is shown in FIG. 4B.

Figure 4D:
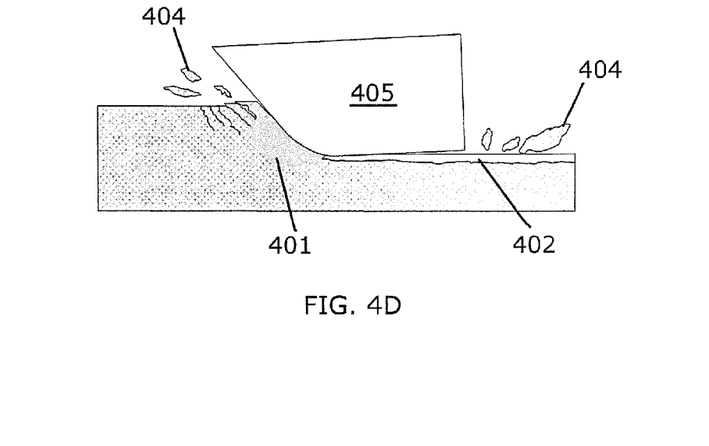
FIG. 4D illustrates an embodiment of machining outside of the ductile mode machining regime wherein brittle fracture occurs.

FIG. 4D illustrates a cutting process wherein insufficient pressure is used, and as illustrated, brittle fracture 404 of the silicon component 400 occurs. Preferably, the diamond cutting tool is a single point diamond cutting tool that has a tool nose radius of about 0.1 to 7 mm. Preferably the single point of the single point diamond cutting tool is a single crystal natural diamond wherein the tool nose radius is dictated by the crystal structure of the diamond. Alternatively, the single point diamond cutting tool can be a synthetic diamond. Due to the sharpness of the diamond cutting tool, by bringing the diamond cutting tool into contact with the component of nonmetallic hard and brittle material during the turning process, a high pressure ductile phase transformation occurs at the contact point between the diamond cutting tool and the component.

Preferably the machining is performed by a diamond cutting tool utilizing a single point turning process. The diamond cutting tool can be a lathe or a flycutting machine comprising a single crystal natural diamond cutting tool or alternatively a synthetic diamond cutting tool. The diamond cutting tool can be fixed while the component of nonmetallic hard and brittle material is rotated. Preferably the component of hard and brittle material is rotated at about 500 to 1,500 revolutions per minute, and more preferably the component is rotated at about 500 to 1,000 revolutions per minute. The single point turning process is configured to machine planar or contoured geometrical shapes into the surface of components formed of the hard and brittle material. In a further embodiment, a lathe implementing a rotary grinding cutting tool is used to first machine (i.e. grind) or rough the component of nonmetallic hard and brittle material into a predetermined shape. Then in a next step, the grinding cutting tool is rotated from the lathe, and a diamond cutting tool is rotated to the lathe. The lathe may then perform methods of ductile mode machining disclosed herein, such that a single machine may perform an initial shaping step (e.g. grinding) and a finishing step (e.g. single point turning) without having to remove or transfer the component of nonmetallic hard and brittle material.

The cutting tool may be assisted with a laser, wherein the high pressure transformation portion and surrounding portions of the component are irradiated with laser radiation. The laser radiation is preferably absorbed by the portion of the surface of the component under the high pressure phase transformation which heats the high pressure phase transformation portion of the component and causes it to reduce in hardness. Since the high pressure phase transformed portion absorbs the laser radiation while the remainder of the component transmits the laser radiation, the high pressure phase transformed portion selectively heats and softens while the remainder of the component is less affected, such that the selectively heated portions may be transformed to the high pressure phase (e.g. amorphous and/or ductile phase portions) more readily. Preferably the laser radiation has a wavelength of about 400 to 1500 nanometers.

The feed rate is a factor which affects the ductile mode machining process, such as decreasing and/or controlling the surface roughness of a surface of the component being machined. The quality of surface finish can be achieved through controlling the feed rate between the cutting tool and the component. Preferably, the feed rate is about 0.1 to 50 µm/rev, and more preferably the feed rate is about 0.2 to 3 µm/rev, wherein larger feed rates can increase surface roughness. During ductile mode machining of the component, the feed rate may be increased and/or decreased such that the surface roughness of the component may be increased or decreased. Surface roughness of a surface of the component of nonmetallic hard and brittle material may also be controlled according to the depth of cut of the cutting tool wherein greater depths of cut lead to more surface roughness. Preferably, the depth of cut is about 0.25 to 50 µm. During ductile mode machining of the component, the depth of cut may be increased and/or decreased such that the surface roughness of the component may be increased or decreased.

As the depth of cut and the feed rate are reduced, the cutting force is also reduced. The cutting force can be a function of the surface roughness, wherein higher cutting forces are due to rougher surfaces wherein a higher cutting force can lead to shortened cutting tool life. Therefore, reduction of the depth of cut and feed rate during machining, can provide a surface of the component with less surface roughness, and can extend the cutting tool life by reducing the cutting force applied during machining.

Single point turning the component of nonmetallic hard and brittle material forms a grooved textured surface wherein the texture of the turned surface is preferably in a spiraling pattern. The spiraling pattern of the grooved textured surface can be formed by a spiraling inward pattern, a spiraling outward pattern, or if desired a combination of spiraling inward and outward patterns. The grooved textured surface additionally exhibits an optical diffraction pattern. Preferably the optical diffraction pattern is in the form of a grating wherein the grating is formed by the grooves in the spiraling pattern. The dimensions of the grooves in the spiraling pattern are dependent on the cutting tool profile, feed rate, the component rotation speed, and the depth of cut wherein the dimensions of the grooves of the spiraling pattern may vary based on the surface geometry of the component.

Defects and quality control information of a ductile mode machined surface of a component may be collected and illustrated through naked eye visual, scatterometry, interferometry, or microscopy data. Irregularities, such as non-uniform surface roughness and/or exposed subsurface damage in the groove pattern can show up as either bright or dark spots in a scatterometry image. For example, a region of the component without grooves (i.e. a region of the component not subjected to ductile mode machining) will predominately scatter light specularly, and the light scattered will appear bright when viewed from an angle where the angle of incidence is about equal to the angle of reflection. The scatterometry data may be collected using a laser with a wavelength of about 630 nm. Preferably the laser is inclined at an angle of about 30 to 45 degrees with respect the normal of the component and the scatterometry data is collected at a fixed radius while the part rotated around its center. Preferably the ductile mode machined component when rotated will exhibit the same scattering pattern.

Figure 5A:
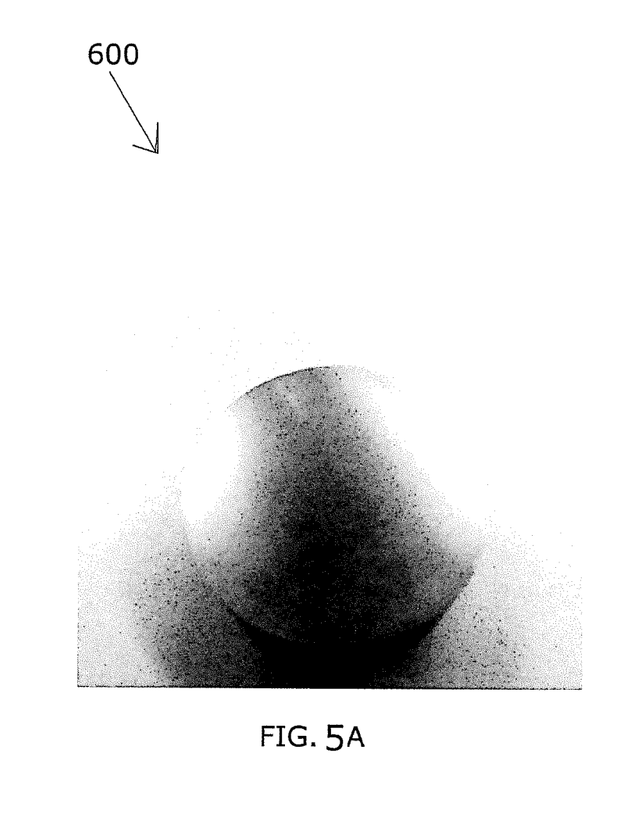
FIGS. 5A, 5B illustrate a Si component before and after an embodiment of ductile mode machining disclosed herein has been performed.
Figure 5B:
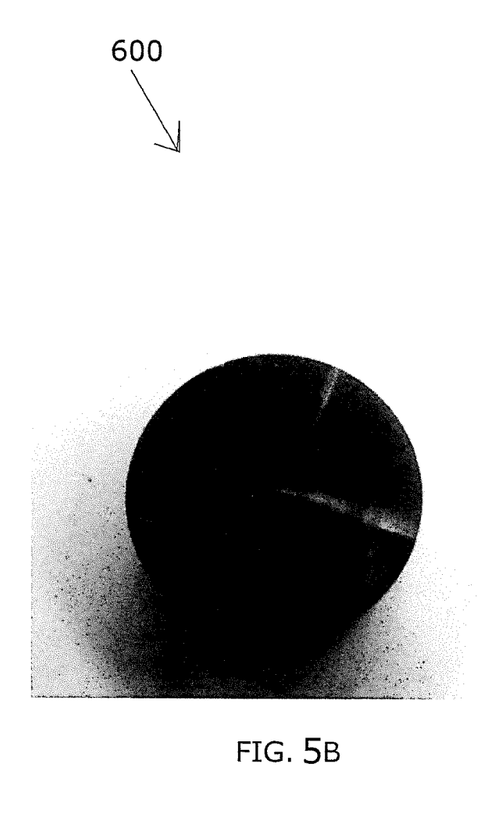

FIG. 5A illustrates a Si component 600 before being subjected to ductile mode machining. FIG. 5B illustrates the Si component 600 after an embodiment of ductile mode machining as disclosed herein has been performed. As shown in FIG. 5B, the Si component 600 comprises an optical diffraction pattern which is in the form of a grating wherein the grating is formed by the grooves in the spiraling pattern formed by the single point turning process.

Further disclosed herein is a method of replacing a component of a plasma processing apparatus comprising. The method comprises removing a used component, such as a showerhead electrode, from the plasma processing apparatus when the used component is eroded; and replacing the used component with a component formed according to methods disclosed herein. Furthermore, a component of brittle material, such as a showerhead electrode may be removed from the plasma processing apparatus when the component is eroded, and replaced with a refurbished component wherein the refurbished component is formed according to methods disclosed herein.

Additionally, disclosed herein is a method of etching a semiconductor substrate in a plasma processing apparatus. The method comprises installing a component formed according to an embodiment of ductile mode machining disclosed herein into a plasma chamber of a plasma processing apparatus, and plasma etching at least one semiconductor substrate in the plasma chamber.

It will be appreciated by those of ordinary skill in the art that the present invention can be embodied in other specific forms without departing from the spirit or essential characteristics thereof. The presently disclosed embodiments are therefore considered in all respects to be illustrative, and not restrictive. The scope of the invention is indicated by the appended claims, rather than the foregoing description, and all changes that come within the meaning and range of equivalence thereof are intended to be embraced therein.

What is claimed is:

1. A method of ductile mode machining a component of a plasma processing apparatus wherein the component is made of nonmetallic hard and brittle material, comprising:
   single point turning the component with a diamond cutting tool causing a portion of the nonmetallic hard and brittle material to undergo a high pressure phase transformation to form a ductile phase portion of the hard and brittle material during chip formation wherein a turned surface is formed from a phase changed material and the turned surface is a grooved textured surface of phase changed material.

2. The method of claim 1, wherein (a) a predetermined surface roughness (Ra) of the turned surface of the component forms the grooved textured surface of the turned component; (b) the predetermined surface roughness of the turned surface is about 0.001 to 0.2 µm; (b) the grooved textured surface of the turned surface is in a spiraling pattern; (c) the grooved textured surface of the turned surface exhibits an optical diffraction pattern; (d) the grooved textured surface of the turned surface forms a finished turned surface; and/or (e) the component is formed of Si and the phase changed material forming the turned surface includes amorphous silicon, Si-III and Si-XII.

3. The method of claim 1, wherein the grooved textured surface is subsurface damage free.

4. The method of claim 1, wherein the high pressure transformation portion is irradiated with laser radiation such that (a) the laser radiation is absorbed by the ductile phase material to heat the ductile phase material and cause it to reduce in hardness; and/or (b) the laser radiation has a wavelength of about 400 to 1500 nanometers.

5. The method of claim 1, wherein (a) the depth of cut is about 0.25 to 50 µm, the feed rate is about 0.1 to 50 µm/rev, and the component is rotated at about 500 and 1,500 revolutions per minute; (b) the depth of cut is about 0.25 to 50 µm, the feed rate is about 0.2 to 3 µm/rev, and the component is rotated at about 500 and 1,000 revolutions per minute; and/or (c) the depth of cut is increased and/or decreased while single point turning the component; and/or (d) the feed rate is increased and/or decreased while single point turning the component.

6. The method of claim 1, wherein the brittle material is selected from the group consisting of ceramic, silicon containing, and quartz materials.

7. The method of claim 1, wherein the component comprises an edge ring, a showerhead electrode, a window, a gas injector, a plasma confinement ring, chamber liner, or an electrostatic chuck.

8. The method of claim 1, wherein the component is a dielectric chamber part of a plasma processing apparatus.

9. The method of claim 1, wherein (a) the turned surface of the component has a contoured surface geometry; and/or (b) the turned surface of the component forms a planar surface.

10. The method of claim 9, wherein the contoured surface geometry is a three dimensional surface of a bevel, a chamfer, or a curved surface.

11. The method of claim 9, wherein (a) the variation of flatness of the planar surface is less than about 1.4 µm; or (b) the variation of flatness of the planar surface is less than about 0.3 µm.

12. The method of claim 1, wherein (a) the phase changed material forming the turned surface of the ductile mode machined component has a thickness of about 0.01 to 2 µm; and/or (b) the phase changed material forming the turned surface of the ductile mode machined component has a thickness of about 0.01 to 0.5 µm.

13. The method of claim 1, further including collecting optical data of the turned surface and processing the optical data such that irregularities may be detected.

14. The method of claim 13, wherein (a) the optical data is collected through naked eye visual, scatterometry, microscopy, or interferometry; and/or (b) detecting irregularities includes detecting non-uniform surface roughness or exposed subsurface damage.

15. The method of claim 1, further including (a) grinding or roughing the component of hard and brittle material into a predetermined shape with a grinding tool installed on a lathe prior to ductile mode machining the component; and/or (b) rotating from the grinding tool to the diamond cutting tool installed on the lathe such that the component may be diamond turned into a predetermined shape.

16. The method of claim 1, wherein the diamond cutting tool performing the single point turning is (a) a single crystal natural diamond cutting tool; or (b) a synthetic diamond cutting tool.

17. A method of replacing a component of a plasma processing apparatus comprising: removing a used component from the plasma processing apparatus when the used component is eroded; and replacing the used component with the component made by the method of claim 1.

18. The method of claim 17, wherein the used component is replaced with a refurbished component, wherein a surface of the component is refurbished according to the method of claim 1.

19. The method of claim 17, wherein the component material is selected from the group consisting of ceramic, silicon containing, and quartz material.

20. A method of etching a semiconductor substrate in a plasma processing apparatus, comprising: installing a component formed according to the method of claim 1 in a plasma etching chamber of a plasma processing apparatus; and plasma etching at least one semiconductor substrate in the plasma chamber.

\* \* \* \* \*